United States Patent [19]

Jonckheere et al.

[11] Patent Number: 5,731,124
[45] Date of Patent: Mar. 24, 1998

[54] METHOD FOR PREPARING AN ALUMINUM FOIL FOR USE AS A SUPPORT IN LITHOGRAPHIC PRINTING PLATES

[75] Inventors: Marcus Jonckheere, Oostkamp; Paul Coppens, Turnhout, both of Belgium

[73] Assignee: AGFA-Gevaert, N.V., Mortsel, Belgium

[21] Appl. No.: 729,631

[22] Filed: Jun. 26, 1996

Related U.S. Application Data

[63] Continuation of Ser. No. 35,965, Mar. 23, 1993, abandoned.

[30] Foreign Application Priority Data

Apr. 22, 1992 [EP] European Pat. Off. .............. 92201131

[51] Int. Cl.$^6$ .............................. G03F 7/07; G03F 7/09; G03C 8/28; B41N 1/00
[52] U.S. Cl. .............. 430/231; 430/204; 430/229; 430/278.1; 101/459; 148/275; 148/276; 148/285; 205/50; 205/139; 205/152; 205/153; 205/201; 205/214; 205/229
[58] Field of Search .................... 430/204, 231, 430/278.1, 229; 101/459; 205/50, 139, 152, 153, 201, 214, 229; 148/275, 276, 285

[56] References Cited

U.S. PATENT DOCUMENTS

| | | | |
|---|---|---|---|
| 3,787,298 | 1/1974 | Niebylski | 205/50 |
| 3,849,264 | 11/1974 | Weber et al. | 205/50 |
| 4,425,420 | 1/1984 | DeJaeger et al. | 430/204 |
| 5,068,165 | 11/1991 | Coppens et al. | 430/204 |

FOREIGN PATENT DOCUMENTS 5265215  10/1993  Japan.

Primary Examiner—Richard L. Schilling
Attorney, Agent, or Firm—Breiner & Breiner

[57] ABSTRACT

The present invention provides a method for preparing an aluminium foil comprising the steps of roughening an aluminium foil and subsequently anodizing said aluminium foil characterized in that after said anodization said aluminium foil is cleaned using an aqueous bicarbonate containing solution. The present invention further provides a monosheet silver salt diffusion transfer material having as a support the alumium foil obtainable from the above defined method. The step of cleaning in the bicarbonate containing solution improves the adhesion of an image receiving layer containing physical development nuclei to the aluminum foil as revealed from the increased amount of silver precipitated in the image receiving layer when the aluminum foil provided with an image receiving layer is used in a diffusion transfer reversal (DTR) process.

9 Claims, No Drawings

METHOD FOR PREPARING AN ALUMINUM FOIL FOR USE AS A SUPPORT IN LITHOGRAPHIC PRINTING PLATES

This is a continuation of application Ser. No. 08/035,965 filed Mar. 23, 1993 now abandoned.

DESCRIPTION

1. Field of the Invention

The present invention relates to a method for preparing an aluminium foil suitable for use as a support for an imaging element for making a printing plate according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving layer and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

Two main types of mono-sheet DTR materials that are distinct because of their different layer arrangement and processing are known. The first type of mono-sheet DTR material comprises on a support, generally paper or a resin support such as polyester, in the order given a silver halide emulsion layer and an image receiving layer containing physical development nuclei as a surface layer. After information-wise exposure and development according to the DTR process a silver image is formed in the surface layer. Since the underlying layers are hydrophilic in nature and the silver image formed on the surface is hydrophobic or can be renderred hydrophobic the thus obtained plate can be used without further processing. These type of printing plates have a low printing endurance typically around 10000 copies.

On the other hand mono-sheet DTR materials are known that comprise a hydrophilic support provided with an image receiving layer containing physical development nuclei and on top thereof a silver halide emulsion layer. After information-wise exposure and development according to the DTR-process a silver image is formed in the image receiving layer. In order to obtain a lithographic printing plate it will then be necessary to remove the now useless silver halide emulsion layer to expose the silver image formed in the image receiving layer. Said removal is generally carried out by rinsing the element with cold or warm water. This type of printing plate is disclosed in e.g. EP-A-278766, EP-A-483415 and EP-A-410500.

As a preferred support for the latter type of printing plates a roughened and anodized aluminium foil is used and high printing endurances can in principal be obtained. Such type of supports are well known for preparing printing plates using an imaging element having as a light sensitive coating photopolymers (hereinafter called PS-plates) instead of silver halide and are disclosed in e.g. DE-3717757, EP-A-167751, DE-3036174, U.S. Pat. No. 4,336,113, U.S. Pat. No. 4,374,710, U.S. Pat. No. 3,980,539, U.S. Pat. No. 3,072,546, U.S. Pat. No. 3,073,765, U.S. Pat. No. 3,085,950, U.S. Pat. No. 3,935,080 and U.S. Pat. No. 4,052,275.

However the requirements imposed on the aluminium foils for use as supports for PS-plates are different from the requirements imposed on the aluminium foils for use in the silver salt diffusion transfer process. Indeed, commonly employed aluminium foils as supports for PS-plates are not suited for preparing printing plates according to the silver salt diffusion transfer process.

In order to obtain printing plates according to the DTR process having good printing properties i.e. good ink acceptance in the image areas, no ink acceptance in the non-image areas called staining or toning and high printing endurances it is required that the adhesion of the image receiving layer containing the physical development nuclei is firm. When the adhesion of the image receiving layer to the aluminium foil is poor a certain amount of silver image deposited in the image receiving layer will be removed together with the silver halide emulsion layer during rinsing of the imaging element so that the actual yield or amount of silver deposited in the image receiving layer will be low and as a consequence the printing endurance may be low. Furthermore if the adhesion of the image receiving layer to the aluminium foil is low the silver image will also be worn away more rapidly during printing.

SUMMARY OF THE INVENTION

It is an object of the present invention to provide a method for preparing an aluminium foil suitable for being provided with an image receiving layer containing physical development nuclei.

It is an other object of the present invention to provide an aluminium based mono-sheet DTR material for preparing a lithographic printing plate having good printing properties.

Further objects of the present invention will be clear from the description hereinafter.

According to the present invention there is provided a method for preparing an aluminium foil comprising the steps of roughening an aluminium foil and subsequently anodizing said aluminium foil characterized in that after said anodization said aluminium foil is cleaned using an aqueous bicarbonate containing solution.

According to the present invention there is provided a mono-sheet DTR material comprising on the aluminium support obtainable by the above described method an image receiving layer containing physical development nuclei and a silver halide emulsion layer.

DETAILED DESCRIPTION OF THE INVENTION

According to the present invention it has been found that cleaning of an aluminium foil by means of an aqueous solution containing a bicarbonate after toughening and anodizing of an aluminium foil the adhesion of an image receiving layer containing physical development nuclei to the aluminium foil is improved as revealed from the increased amount of silver precipitated in the image receiving layer when the aluminium foil provided with an image receiving layer is used in a DTR-process.

As mentioned above a DTR-image on a hydrophilic background i.e. on a hydrophilic aluminium foil can be used in lithographic printing. Because of the improved adhesion of the nuclei to the aluminium foil prepared according to the invention more silver is deposited in the image receiving layer and a silver image is obtained with an improved wear resistance and as a consequence high printing endurance can be obtained.

Suitable bicarbonates for use in accordance with the present invention are e.g. sodium bicarbonate, potassium bicarbonate, ammonium bicarbonate, calcium bicarbonate, barium bicarbonate etc. Sodium bicarbonate is preferably used. The amount of bicarbonate in the aqueous solution is preferably between 0.05 mol/l and 1 mol/l, more preferably between 0.1 mol/l and 0.7 mol/l and most preferably between 0.1 mol/l and 0.5 mol/l. The pH of the aqueous solution is preferably between 4 and 10.

According to the present invention the roughening of the aluminium foil can be performed according to the methods well known in the prior art.

The surface of the aluminium substrate can be roughened either by mechanical, chemical or electrochemical graining or by a combination of these to obtain a satisfactory adhesiveness of a silver halide emulsion layer to the aluminium support and to provide a good water retention property to the non-printing areas that will form the non-printing areas on the plate surface.

Mechanical graining can be performed by e.g. sand blasting, ball graining, wire graining, brush graining, slurry graining or a combination of these, etc. . . .

Chemical graining can be done e.g. by alkali etching as disclosed in Jap. Patent Application No. 61304/76, with a saturated aqueous solution of an aluminium salt of a mineral acid, etc. . . .

The electrochemical graining process is preferred because it can form a uniform surface roughness having a large average surface area with a very fine and even grain which is commonly desired when used for lithographic printing plates.

To obtain a finely grained surface, topography the optimum concentration and temperature of the electrolytic solution, the current form and density must be chosen.

According to the present invention electrochemical graining can be conducted in a hydrochloric and/or nitric acid containing electrolyte solution using an alternating or direct current. Other aqueous solutions that can be used in the electrochemical graining are e.g. acids like HCl, HNO$_3$, H$_2$SO$_2$, H$_3$PO$_4$, that if desired, contain additionally one or more corrosion inhibitors such as Al(NO$_3$)$_3$, AlCl$_3$, boric acid, chromic acid, sulfates, chlorides, nitrates, monoamines, diamines, aldehydes, phosphates, H$_2$O$_2$, etc. . . .

Electrochemical graining in connection with the present invention can be performed using single-phase and three-phase alternating current. Alternating current waves can be a sine wave, a square wave, trapezoidal wave, etc. The anodic charge may be greater or lower than the cathodic charge. The voltage applied to the aluminium plate is about 1–60 V and preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

Mechanical and electrochemical methods may be combined as disclosed in U.S. Pat. No. 4,476,006 and 4,477,317.

Roughening in the present invention is preferably carried out so that an average center line roughness (Ra) of the surface may range form 0.3 to 1.3 µm.

The roughening is preferably preceded by a degreasing treatment mainly for removing fatty substances from the surface of the aluminium foil.

Therefore the aluminium foil may be subjected to a degreasing treatment with a surfactant and/or an aqueous alkaline solution to thereby remove rolling oil, dust, rust and other impurities on the surface thereof. Degreasing can be performed by a 2-step treatment either treating the aluminium foil with an alkaline solution followed by a desmutting in an acidic solution or degreasing in an acidic solution followed by an alkaline desmutting. Acidic solutions preferably contain chromic acid, phosphoric acid or sulphuric acid, and usable alkaline solutions may contain NaOH, KOH, etc.

Preferably roughening is followed by a chemical etching step using an aqueous solution containing an acid. The chemical etching is preferably carried out at a temperature of at least 30° C. more preferably at least 40° C. and most preferably at least 50° C. When too low temperatures during chemical etching are employed a poor adhesion of the image receiving layer to the aluminium foil may result. There is no specific upper limit as to the temperature of chemical etching but for convenience the temperature will generally be kept below the boiling point of the solution preferably below 90° C.

Suitable acids for use in the aqueous etch solution are preferably inorganic acids and most preferably strong acids. Examples of acids that are particularily suitable are e.g. H$_2$SO$_4$, HCl, HNO$_3$, HF, H$_3$PO$_4$ etc. or mixtures thereof. Weak acids may also be used in admixture with strong acids. The total amount of acid in the aqueous etch solution is preferably at least 150 g/l, more preferably at least 200 g/l and most preferably at least 250 g/l. The actual amount of acid is determined e.g. by temperature and duration of etching. Generally lower amounts of acid can be used with increasing temperature and duration. The duration of chemical etching is preferably between 3 s and 5 min. and more preferably between 3 s and 4 min.

Alternatively chemical etching may be carried out using an aqueous solution containing alkali. Suitable alkali are e.g. sodium hydroxide, potassium hydroxide etc. Preference is however given to chemical etching using an acidic solution since it has been found that the effect of the cleaning of the aluminium foil using a bicarbonate solution after anodization is much more pronounced when the chemical etching is done using an acidic solution.

According to the present invention after the roughening the aluminium foil and optional chemical etching the aluminium foil is anodized which may be carried out as follows.

An electric current is passed through the grained aluminium foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ Al$_2$O$_3$.H$_2$O. The anodized aluminium foil may subsequently be rinsed with demineralised water within a temperature range of 10°–80° C.

Preferably each of the above described steps is separated by a rinsing step to avoid contamination of the liquid used in a particular step with that of the preceding step.

Subsequent to the preparation of the aluminium foil as described above the aluminium foil may be immediately coated with a solution containing the physical development nuclei or may be coated with said solution at a later stage.

Physical development nuclei suitable for use in accordance with the present invention are sulphides of heavy metals e.g. sulphides of antimony, bismuth, cadmium, cobalt, lead, nickel, palladium, platinum, silver, and zinc or selenides of the aforementioned heavy metals and tin (II) halides. Further suitable nuclei are heavy metals, e.g. silver, gold, platinum, palladium, and mercury preferably in colloidal form. Preferred physical development nuclei for use in connection with the present invention is a Carey lea silver sol.

The layer containing physical development nuclei is preferably free of binder or contains only a small amount of binder necessary for stabilizing the physical development nuclei. Typically the amount of binder will be less than 1 g/m$^2$. If a binder is used preference is given to a hydrophilic binder e.g. gelatin or polyvinyl alcohol.

The aluminium foil used in accordance with the present invention can be made of pure aluminium or of an aluminium alloy, the aluminium content of which is at least 95%. The alloy may be composed of aluminium as a main component and other metals e.g. silicon, manganese, copper, magnesium, chromium, lead, zinc, nickel, bismuth, iron, titanium and negligible amounts of other impurities. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The aluminium support according to the present invention is especially suited for preparing a mono-sheet DTR material. According to the method of the present invention for obtaining a mono-sheet DTR material an aluminium foil, prepared as described above and provided with an image receiving layer is provided with a silver halide emulsion layer as a light sensitive layer.

The photosensitive silver halide used in the present invention may comprise silver chloride, silver bromide, silver bromoiodide, silver chlorobromoiodide and the like, or mixtures thereof. To obtain a sufficiently high rate of solution of the silver halide and a satisfactory gradation necessary for graphic purposes a silver halide emulsion mainly comprising silver chloride is used preferably. This silver chloride emulsion may comprise silver bromide up to 40 mole % preferably up to 20 mole % and/or silver iodide up to 2% preferably up to 0.5%. The silver iodide is preferably contained on the surface of the silver halide grains.

The silver halide emulsions may be coarse or fine grain and can be prepared by any of the well known procedures e.g. single jet emulsions, double jet emulsions such as Lippmann emulsions, ammoniacal emulsions, thiocyanate- or thioether-ripened emulsions such as those described in U.S. Pat. Nos. 2,222,264, 3,320,069, and 3,271,157. Surface image emulsions may be used or internal image emulsions may be used such as those described in U.S. Pat. Nos. 2,592,250, 3,206,313, and 3,447,927. If desired, mixtures of surface and internal image emulsions may be used as described in U.S. Pat. No. 2,996,382.

The silver halide particles of the photographic emulsions may have a regular crystalline form such as cubic or octahedral form or they may have a transition form. Regular-grain emulsions are described e.g. in J. Photogr. Sci., Vol. 12, No. 5, September/October 1964, pp. 242–251. The silver halide grains may also have an almost spherical form or they may have a tabular form (so-called T-grains), or may have composite crystal forms comprising a mixture of regular and irregular crystalline forms. The silver halide grains may have a multilayered structure having a core and shell of different halide composition. Besides having a differently composed core and shell the silver halide grains may comprise also different halide compositions and metal dopants in between.

Two or more types of silver halide emulsions that have been prepared differently can be mixed for forming a photographic emulsion in a photographic material for use with an image receiving material according to the present invention.

The average size expressed as the average diameter of an equivalent sphere of the silver halide grains may range from 0.2 to 1.2 um, preferably between 0.2 μm and 0.8 μm, and most preferably between 0.3 μm and 0.6 μm. The size distribution can be homodisperse or heterodispere. A homodisperse size distribution is obtained when 95% of the grains have a size that does not deviate more than 30% from the average grain size.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A 493,464 and 568,687, and polyamines such as diethylene triomine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions can also be sensitized with polyalkylene oxide derivatives, e.g. with polyethylene oxide having a molecular weight of 1000 to 20,000, or with condensation products of alkylene oxides and aliphatic alcohols, glycols, cyclic dehydration products of hexitols, alkyl-substituted phenols, aliphatic carboxylic acids, aliphatic amines, aliphatic diamines and amides. The condensation products have a molecular weight of at least 700, preferably of more than 1000. It is also possible to combine these sensitizers with each other as described in BE-A 537,278 and GB-A 727,982.

The spectral photosensitivity of the silver halide can be adjusted by proper spectral sensitization by means of the usual mono- or polymethine dyes such as acidic or basic cyanines, hemicyanines, oxonols, hemioxonols, styryl dyes or others, also tri- or polynuclear methine dyes e.g. rhodacyanines or neocyanines. Such spectral sensitizers have been described by e.g. F. M. HAMER in "The Cyanine Dyes and Related Compounds" (1964) Interscience Publishers, John Wiley & Sons, New York.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole.

The silver halide emulsions may further contain either or not in combination with one or more developing agents pH controlling ingredients, and other ingredients such as antifogging agents, development accelerators, wetting agents, and hardening agents for gelatin.

The silver halide emulsion layer may comprise light-screening dyes that absorb scattering light and thus promote the image sharpness and, as a consequence thereof, the sharpness of the final printed copy. Light-absorbing dyes that can be used as light-screening dyes have been described in i.a. U.S. Pat. No. 4,092,168, U.S. Pat. No. 4,311,787 and DE-A 2,453,217. More details about the composition, preparation and coating of silver halide emulsions can be found in e.g. Product Licensing Index, Vol. 92, December 1971, publication 9232, p. 107–109.

Apart from negative-working silver halide emulsions that are preferred for their high light-sensitivity, use can be made also of direct-positive silver halide emulsions that produce a positive silver image.

For instance, direct-positive emulsions of the type described in U.S. Pat. No. 3,062,651 may be employed. In direct-positive emulsions a non-hardening fogging agent such as stannous chloride and formamidine sulphinic acid can be used.

The silver halide emulsion layer usually contains gelatin as hydrophilic colloid binder. Mixtures of different gelatins with different viscosities can be used to adjust the rheological properties of the layer. Instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

More details of silver halide emulsions suitable for use in accordance with the present invention can be found in e.g. EP-A-410500.

The mono-sheet DTR material according to the present invention may contain additional layers such as e.g. an antihalation layer. In an especially preferred embodiment a layer containing a non-proteinic hydrophilic film forming polymer, latex particles or mixtures thereof as disclosed in EP-A-438415 and EP-A-410500 may be provided between the image receiving layer and the silver halide emulsion layer. Such a layer will facilate the removal of the silver halide emulsion layer in order to expose the silver image formed in the image receiving layer.

The silver halide emulsion layer and optional other layers may be coated to the aluminium support according to the present invention provided with an image receiving layer using commonly applied coating techniques as silde hopper coating or curtain coating. Alternatively these layers may be first coated to a temporary support e.g. a polyester film and subsequently laminated to the aluminium support as disclosed in EP-A-410500.

Although the aluminium support support according to the present invention is mainly intended as a support for a monosheet DTR material it is equally well suited for use as a receiving material in a two-sheet DTR process.

The above described mono-sheet DTR material can be imaged and processed to obtain a lithographic printing plate as described in EP-A-410500 or EP-A-483415.

The present invention is illustrated by the following examples without however limiting it thereto. All parts are by weight unless otherwise specified.

EXAMPLE

A 0.30 mm thick aluminium foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0.6 µm. The aluminium plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 $g/m^2$ of $Al_2O_3.H_2O$ and the foil was then washed with demineralised water and dried. The thus obtained aluminium foil is called support A.

A support B was prepared similar to the above procedure with the difference that as a final step before drying the aluminium foil was treated with an aqueous solution containing 20 g/l of $NaHCO_3$ at 45° C. for 30 sec and then rinsed with demineralised water.

A support C was made similar to the procedure disclosed for support A, with the only difference that after graining the aluminium plate was desmutted for 240 seconds instead of 120 seconds.

A support D was made in the same way as described for support B, with the only difference that after graining the aluminium plate was desmutted for 240 seconds instead of 120 seconds.

The 4 obtained aluminium supports were each coated with a silver-receptive stratum from a silver sol in water comprising no binder, prepared according to the Carey Lea method, the resulting stratum having a weight in dried condition of 8 mg of silver per $m^2$. A water-swellable intermediate layer was then provided on the dry silver-receptive stratum from an aqeuous composition in such a way that the resulting dried layer had a weight of 0.33 g of polyvinyl alcohol per $m^2$, said composition comprising:

| | |
|---|---|
| 5% aqueous solution of polyvinyl alcohol having a molecular weight of 10.000 and comprising 95 mol % of vinyl alcohol units and 5 mol % of vinyl acetate units | 100 ml |
| Helioechtpapierrot BL (trade mark for a dye sold by BAYER AG, D-5090 Leverkusen, West-Germany) | 15 g |
| saponine | 2.5 g |
| sodium oleylmethyltauride | 1.25 g |
| demineralized water | 205 ml |

(pH-value: 5.6)

Finally a substantially unhardened photosensitive negative-working cadmium-free gelatin silver chlorobromoiodide emulsion layer (97.98/2/0.02 mol %) was provided to each of the obtained elements, the silver halide being provided in an amount corresponding to 2.40 g of silver nitrate per $m^2$ and the gelatin content of the resulting photosensitive emulsion layer being 1.58 $g/m^2$.

The 4 obtained unexposed monosheet DTR materials were immersed for 8 s at 25° C. in a freshly made developing solution having the following ingredients:

| | |
|---|---|
| carboxymethylcellulose | 18 g |
| sodium hydroxide | 22.5 g |
| anhydrous sodium sulphite | 120 g |
| hydroquinone | 20 g |
| 1-phenyl-3-pyrazolidinone | 3 g |
| potassium bromide | 0.75 g |
| anhydrous sodium thiosulphate | 7.5 g |
| ethylene diamine tetraacetic acid tetrasodium salt | 2 g |
| demineralized water to make | 1000 ml | pH (25° C.)=13

The initiated diffusion transfer was allowed to continue for 30 s to form a silver layer on each of the 4 supports.

To remove the developed silver halide emulsion layer and the swollen intermediate layer from the aluminium foils the developed monosheet DTR materials were rinsed for 30 s with a water jet at 30° C.

The amount of silver deposited (silver yield) in the image receiving layer was then measured using an analytical X-ray Fluorescence Spectrophotometer PHILIPS 1400 (commercially available from Philips). The results obtained for each of the 4 DTR materials were as follows:

| Support | bicarbonate | silver yield (g/m$^2$) |
|---|---|---|
| A | no | 0.87 |
| B | yes | 1.20 |
| C | no | 0.92 |
| D | yes | 1.30 |

From the above it can be seen that when the aluminium foil has been treated with a bicarbonate solution the silver yield is improved. Since the silver yield is an important parameter influencing the printing endurance of the printing plate the printing endurance can be increased with a bicarbonate treatment according to the invention.

We claim:

1. A method for preparing an aluminum foil support for an image receiving layer containing physical development nuclei in a photographic printing plate comprising the steps of (i) roughening an aluminum foil to provide an average center line roughness of the surface within the range from about 0.3 to 1.3 μm, (ii) anodizing said roughened aluminum foil of step (i) and (iii) cleaning said anodized aluminum foil of step (ii) with an aqueous solution containing bicarbonate in an amount between 0.1 mole/l and 0.5 mol/l, the adherence of an image receiving layer containing physical development nuclei on said aluminum foil being greater in comparison to a similarly treated aluminum foil except that said aluminum foil has not been cleaned according to step (iii).

2. A method according to claim 1 wherein said bicarbonate is sodium bicarbonate, potassium bicarbonate, ammonium bicarbonate, calcium bicarbonate or magnesium bicarbonate.

3. A method according to claim 1 wherein after said roughening and before said anodization a chemical etching step is carried out.

4. A method according to claim 3 wherein said chemical etching is carried out using an aqueous solution containing an acid.

5. A method according to claim 4 wherein said acid is contained in said aqueous solution in an amount of at least 150 g/l.

6. A method according to claim 4 wherein said chemical etching is carried out at a temperature of at least 30° C.

7. A method according to claim 1 wherein an image receiving layer containing physical development nuclei is applied after cleaning of said aluminium foil with said aqueous bicarbonate containing solution.

8. A method according to claim 7 wherein there is further applied a silver halide emulsion layer to said image receiving layer.

9. A mono-sheet DTR material produced by the process of claim 8.

* * * * *